United States Patent [19]

Madan

[11] Patent Number: 5,468,676
[45] Date of Patent: Nov. 21, 1995

[54] TRENCH ISOLATION STRUCTURE AND METHOD FOR FORMING

[75] Inventor: Sudhir K. Madan, Dallas, Tex.

[73] Assignee: Texas Instruments Incorporated, Dallas, Tex.

[21] Appl. No.: 261,618

[22] Filed: Jun. 17, 1994

Related U.S. Application Data

[62] Division of Ser. No. 949,656, Sep. 23, 1992, Pat. No. 5,350,941.

[51] Int. Cl.$^6$ .................................................. H01L 21/76
[52] U.S. Cl. .............................. 437/70; 437/69; 437/67; 148/DIG. 50
[58] Field of Search ............................ 437/69, 70, 67; 148/DIG. 50

[56] References Cited

U.S. PATENT DOCUMENTS

| | | | |
|---|---|---|---|
| 4,569,701 | 2/1986 | Oh | 437/67 |
| 4,656,730 | 4/1987 | Lynch et al. | 148/188 |
| 4,835,115 | 5/1989 | Eklund | 437/69 |
| 4,952,524 | 8/1990 | Lee et al. | 437/67 |
| 5,100,830 | 3/1992 | Morita | 437/69 |
| 5,106,777 | 4/1992 | Rodder | 437/70 |
| 5,130,268 | 7/1992 | Liou et al. | 437/67 |

Primary Examiner—Brian E. Hearn
Assistant Examiner—Trung Dang
Attorney, Agent, or Firm—Jacqueline J. Garner; Richard L. Donaldson; William E. Hiller

[57] ABSTRACT

An isolation structure is disclosed which isolates an active region (24) from other proximate active regions. The isolation structure utilizes the combination of a LOCOS structure (26) comprising bird's beak structure (26a) and (26b). A trench (34) is formed through the LOCOS structure (26). A channel stop implant region (40) is formed along the sidewalls of the trench (34). A trench plug (46) is used to fill the trench. The isolation structure thereby uses the isolation capabilities of trench isolation structures, but prevents the leakage currents common along trench sidewalls by isolating the trench sidewalls from the active region using the LOCOS structures.

15 Claims, 3 Drawing Sheets

TRENCH ISOLATION STRUCTURE AND METHOD FOR FORMING

This is a division of application Ser. No. 07/949,656, filed Sep. 23, 1992, now U.S. Pat. No. 5,350,941.

TECHNICAL FIELD OF THE INVENTION

This invention relates in general to the field of electronic devices and more particular to an improved trench isolation structure and method for forming such structure.

BACKGROUND OF THE INVENTION

One of the most significant efforts in the design of electronic systems is the continuing effort to fit more and more active devices within a given area of a semiconductor substrate. This effort involves the reduction of the minimum geometries of semiconductor devices. Additionally, a reduction in the spacing between adjacent semiconductor devices also aids in increasing the density of the active surface area of a semiconductor substrate. If semiconductor devices are positioned too close to one another on a semiconductor substrate, parasitic capacitances and currents can develop which can degrade the performance of the circuit as a whole. As such, a great deal of effort has gone into designing methods and structures to electronically isolate adjacent semiconductor devices while still allowing the semiconductor devices to be positioned closely to one another.

One method of isolation that has been extensively applied in the past is the local oxidation of silicon (LOCOS) technique. Using the LOCOS technique and resulting LOCOS structures, the surface of the active semiconductor substrate is oxidized between active regions of the semiconductor surface to prevent the electronic interaction of adjacent devices. The effectiveness of the LOCOS technique degrades significantly as devices become closer and closer together due to parasitic currents that can develop between adjacent devices beneath the LOCOS structures. These currents are referred to as "punch-through" currents and travel through the bulk semiconductor beneath the LOCOS structures.

An additional method of isolation that has been used in the past is trench isolation. Using this technique, trenches are etched between adjacent active regions of the semiconductor substrate. Deep trenches are effective in preventing the punch-through currents described previously. However, the placement of trenches proximate semiconductor devices can create leakage problems within the devices themselves. For example, a trench that is used to isolate a field effect transistor can degrade the performance of the transistor by creating a conduction path across the channel of the transistor along the side wall of the trench. These current paths are due to the leakage along the surface of the trench side wall. Hence, while the trench can effectively eliminate the punch-through current between adjacent devices, the trench can degrade the performance of the device it is intended to isolate.

Accordingly, a need has arisen for an isolation structure and method that prevents the electronic interaction of adjacent active semiconductor devices but does not degrade the performance of the devices themselves.

SUMMARY OF THE INVENTION

In accordance with the teachings of the present invention, an isolation structure is disclosed that substantially reduces or eliminates problems associated with prior isolation schemes.

According to one embodiment of the present invention, an isolation structure is disclosed that is formed in a semiconductor layer between first and second active regions in order to electrically isolate the first and second active regions one from the other, the semiconductor layer comprising an outer surface, the isolation structure comprising:

a LOCOS structure formed on the outer surface, said LOCOS structure comprising a first bird's beak structure disposed adjacent the first active region and a second bird's beak structure disposed adjacent the second active region; and a trench plug disposed in a trench formed through said LOCOS structure between said first and second bird's beak structures and in said semiconductor layer, said trench comprising sidewalls defining an interface between said trench plug and the semiconductor layer.

BRIEF DESCRIPTION OF THE DRAWINGS

For a more complete understanding of the present invention, and the advantages thereof, reference is now made to the following descriptions taken in conjunction with the accompanying drawings, in which like reference numbers indicate like features and wherein.

DETAILED DESCRIPTION OF THE INVENTION

FIGS. 1a–1g illustrate an isolation structure and method of forming the structure that combines the benefits of trench isolation with LOCOS structures.

Figure 1A:
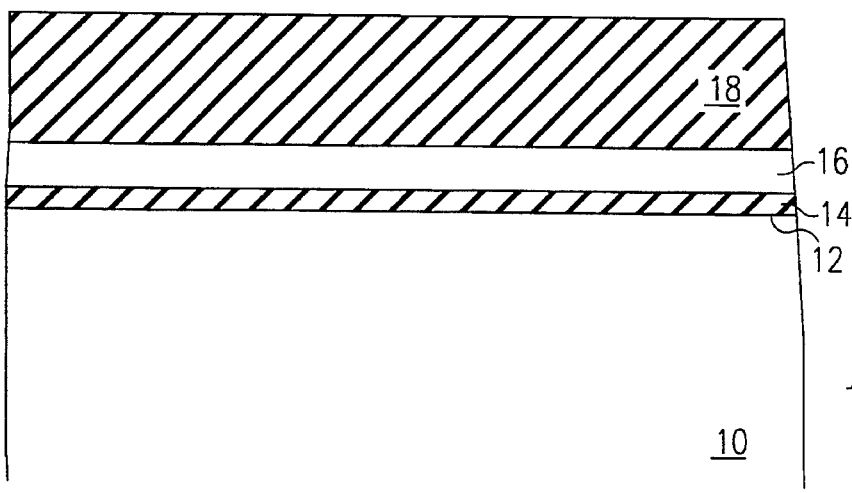
FIGS. 1a–1g are cross-sectional schematic illustrations of a method of forming the trench isolation structure of the present invention.

Referring to FIG. 1a, a p-type semiconductor substrate 10 is shown having an outer surface 12. While the embodiment shown uses a p-type substrate, the teachings of the present invention are equally applicable to n-type substrates. A pad oxide layer 14 is formed on surface 12 to a depth on the order of 300 angstroms. A nitride layer 16 is deposited outwardly from pad oxide layer 14 to a depth on the order of 1,000 angstroms. A thick oxide layer 18 is deposited outwardly from nitride layer 16 to a depth on the order of 5,000 angstroms.

Figure 1B:
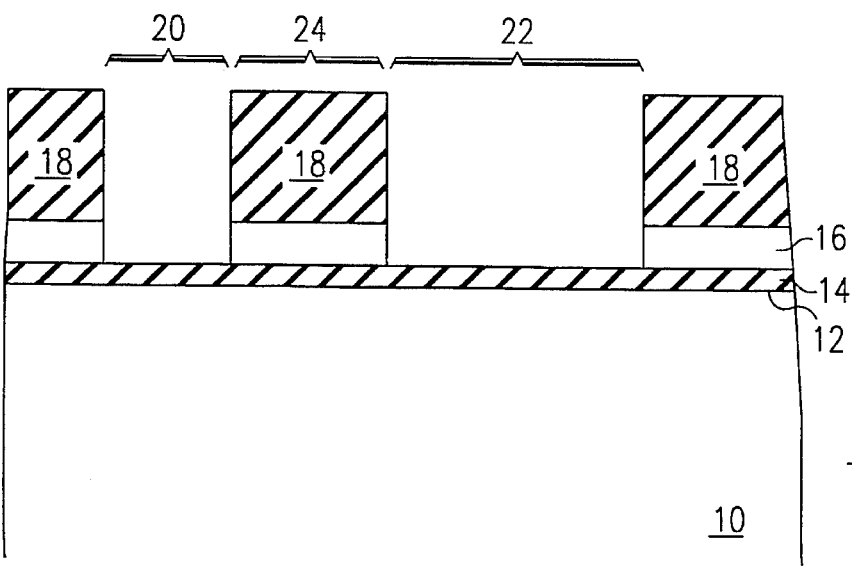

Referring to FIG. 1b, the outer surface of thick oxide layer 18 is patterned and openings are etched to expose portions of the outer surface of pad oxide 14 to define regions 20 and 22 shown in FIG. 1b. Regions 20 and 22 define areas in which isolation structures formed according to the teachings of the present invention will be located. The isolation structures formed in regions 20 and 22 will isolate an active region 24 of semiconductor substrate 10 from surrounding devices. Region 22 is substantially wider than region 20. This disparity in width is illustrated herein in order to teach how isolation structures formed according to the teachings of the present invention may be formed of varying width using the same inventive process and structures. It should be understood that the widths illustrated in FIGS. 1a–1g are shown solely for the purpose of teaching important technical advantages of the present invention and should not be construed to limit the inventive methods and structures disclosed herein to any specific structure or dimension.

Figure 1C:
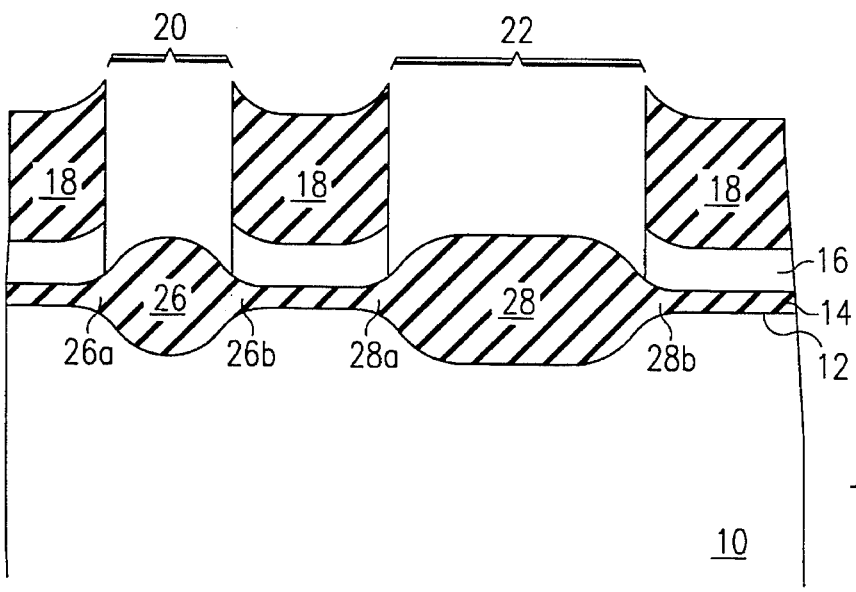

Referring to FIG. 1c, a local oxidation of silicon process (LOCOS) is used to form LOCOS structures 26 and 28 disposed within regions 20 and 22, respectively, as shown in FIG. 1c. The formation of LOCOS structures 26 and 28 results in bird's beak structures indicated at 26a, 26b, 28a, and 28b that impinge beneath nitride layer 16 on the outer areas of regions 20 and 22. Bird's beak structures 26a, 26b, 28a, and 28b cause an outward curvature of nitride layers 16 and thick oxide layer 18 around the periphery of regions 20 and 22 as shown in FIG. 1c.

Figure 1D:
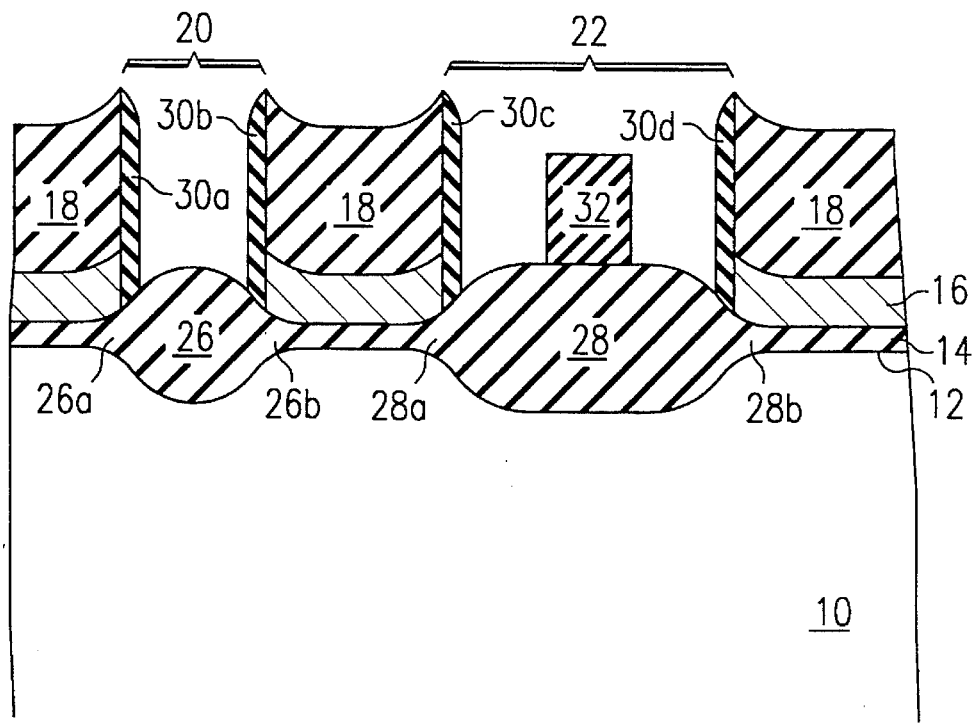

Referring to FIG. 1d, a layer of silicon dioxide (entire layer not shown) is uniformly deposited over the outer topography of the structure shown in FIG. 1c. This layer is anisotropically etched using, for example, a conventional reactive ion etch process to form oxide spacer structures 30a and 30b on opposing sidewalls within region 20 and 30c and 30d on opposing sidewalls within region 22 as shown in FIG. 1d.

Subsequently, a layer (entire layer not shown) of photoresist is uniformly deposited over the entire structure and patterned to form a mask structure 32 substantially centered within region 22 and disposed on the outer surface of LOCOS structure 28. Mask structure 32 serves to subdivide the exposed outer surface of LOCOS structure 28 such that the exposed surfaces of LOCOS surface 28 on either side of mask structure 32 are substantially similar in size to the exposed portion of LOCOS structure 26 between spacers 30a and 30b. This spacing is important to assure that the trenches that will be formed in later steps are of similar widths to allow for efficient and uniform creation and filling of the trenches used in the isolation structure of the present invention.

Figure 1E:
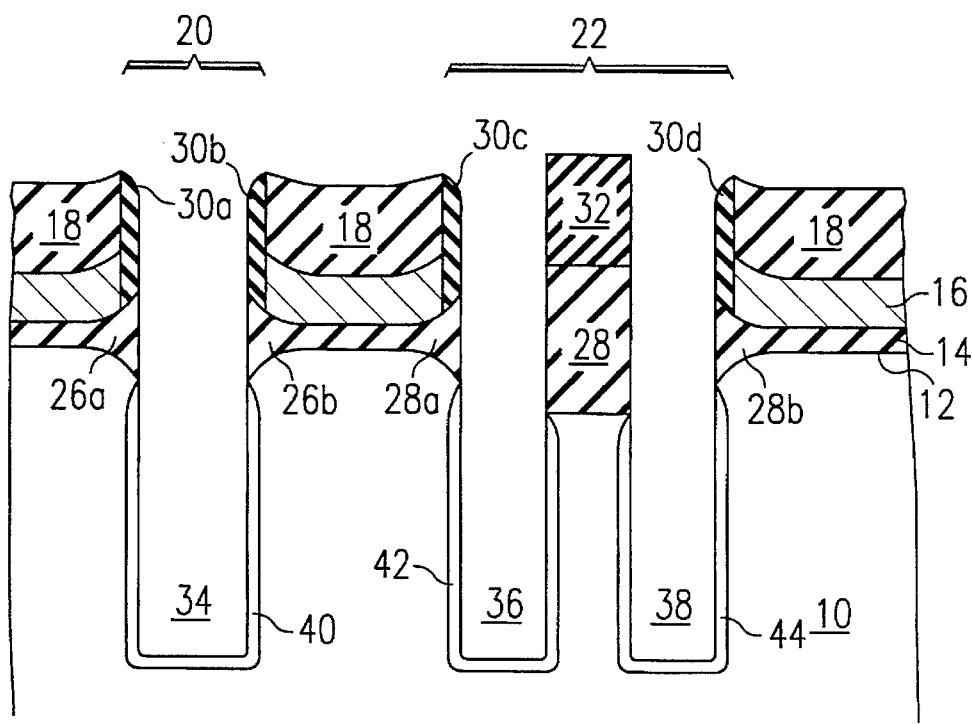

The topography illustrated in FIG. 1d is anisotropically etched to form the topography illustrated in FIG. 1e. The anisotropic etch process removes a portion of layer 18 and portions of the spacers 30a, 30b, 30c, and 30d. Additionally, the anisotropic etch process operates to form trench 34 within region 20 and trenches 36 and 38 within region 22. Trenches 34, 36, and 38 are on the order of 5,000 angstroms in depth. LOCOS structures 26 and 28 are on the order of 3,000 angstroms in depth. Bird's beak structures 26a, 26b, 28a, and 28b impinge laterally from the sidewall of trenches 34, 36, and 38 on the order of 1,000 angstroms. Trenches 34, 36, and 38 are on the order of 3,000 angstroms in width. It should be understood that the dimensions described herein are presented solely for the purposes of teaching the present invention and may be altered significantly for any particular application of the isolation structure of the present invention without departing from the teachings of the present invention. After trenches 34, 36, and 38 are formed using an anisotropic etch process, a p-type dopant is incorporated into the sidewalls of trenches 34, 36, and 38 to form channel stop regions 40, 42, and 44 as shown in FIG. 1e. The dopants can be implanted into the sidewalls of trenches 34, 36 and 38, diffused using solid sources materials according to known methods, etc. Channel stop regions 40, 42 and 44 serve to prevent carriers from adjacent n-channel devices from travelling between active regions isolated using the isolation structures of the present invention.

Figure 1F:
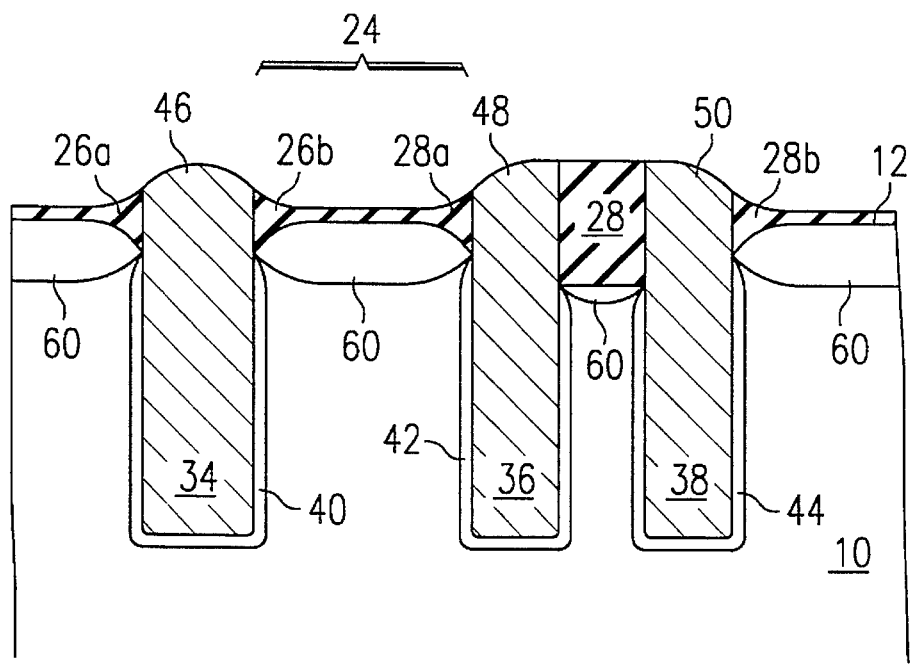

Referring to FIG. 1f, a layer of oxide is deposited over the topography of FIG. 1e to a sufficient depth to fill completely trenches 34, 36, and 38. Isolation region 22 is subdivided into separate trenches 36 and 38 in order for the uniform and complete filling of these trenches to be accomplished at this stage. If trenches of largely disparate width are formed and these trenches are attempted to be filled, voids can occur in the trenches having larger widths. Accordingly, when larger isolation structures are required such as structures required to fill isolation region 22, the subdivision of these regions into individual smaller trenches allows for the uniform filling of these trenches. After the layer of silicon dioxide is deposited to a sufficient depth, the entire structure is etched until the outer surface of layer 14 is re-exposed. This process may be accomplished by first etching the layer of oxide, then stripping nitride layer 16 using phosphoric acid. At this point, a conventional thru-field channel stop implant step can be used to form regions 60 shown in FIG. 1f. Regions 60 operate to suppress any spurious leakage along the LOCOS bird's beak region 26a, 26b, 28a and 28b. The etching process leaves trench plugs 46, 48, and 50 exposed in trenches 34, 36, and 38, respectively, as shown in FIG. 1f. According to an alternate method of practicing the teachings of the present invention, the trenches can be also filled by first depositing a layer of oxide to cover the sidewalls of the trenches followed by a thick layer of polycrystalline silicon to completely fill the trenches. The thick layer of polycrystalline silicon may then be etched back to leave its outer surface positioned just inwardly from the outer surface of nitride layer 16. Subsequently, the outer surface of the layer of polycrystalline silicon can be oxidized to seal its outer surface. Some other materials that can be used to fill the trenches include undoped and doped oxides and their combinations. Some examples of doped oxides are phosphosilicon glass (PSG) and borophosphosilicon glass (BPSG).

Figure 1G:
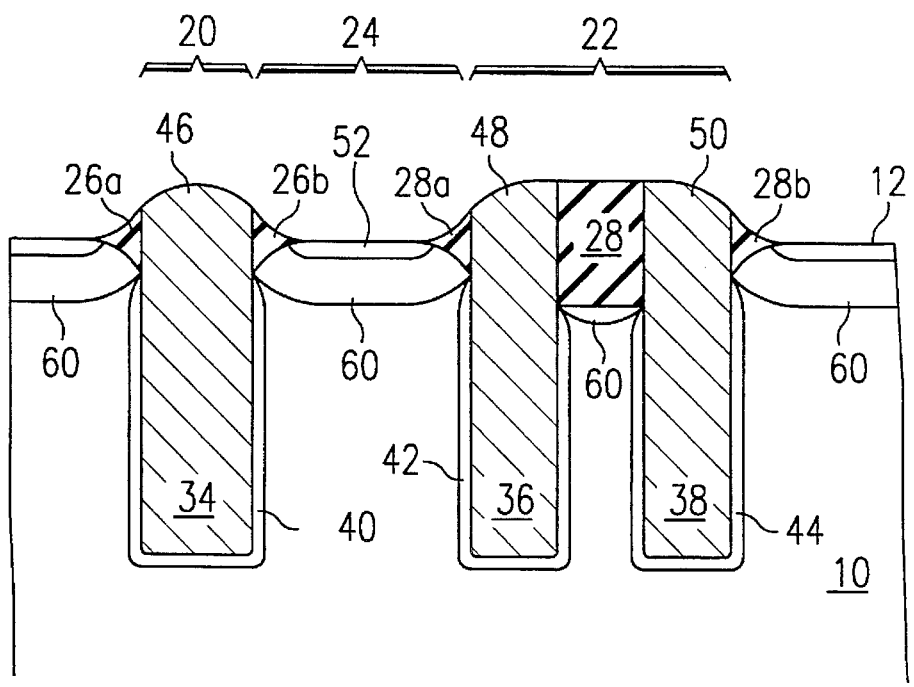

Further process techniques can then be used to create active devices within active region 24, such as channel structures, drain structures such as drain region 52 shown in FIG. 1g, and source structures. Using conventional methods, channel structures within active regions may use polycrystalline silicon gate structures formed over the substrate and isolated from the active regions by gate oxide layers. Regions such as drain region 52 may comprise n+ regions. These and other active devices formed in this manner are isolated from other active regions near active region 24 by isolation structures formed in isolation regions 20 and 22. The isolation structures formed in these regions combine the isolation capabilities of LOCOS structures and the isolation capabilities of trench structures. The trench structures, for example, formed by trench plug 46 and channel stop implant region 40 prevent any punch-through currents between n+ region 52 and adjacent active regions by physically lengthening the path required for stray carriers to travel. The bird's beak region 26b and the channel stop implant regions 60, isolate the n+ region 52 from the sidewalls of trench 34. This isolation suppresses leakage currents from the sidewalls of trench 34 which may occur between, for example, drain region 52 and associated source regions. Accordingly, the isolation structure of the present invention combines the isolation capabilities of trench isolation structures but prevents the degradation of devices formed proximate the trench structures by isolating the trench structures from the devices using the LOCOS structures described.

According to still other methods of practicing the teachings of the present invention, the use of oxide layer 18 can be eliminated if nitride layer 16 can be formed sufficiently thick. Further, the use of spacers 30a, 30b, 30c and 30d are optional and may not be necessary for particular implementations. Similarly, the formation of thru-field implant regions 60 is optional and may not be needed for all implementations. The present invention has been described using LOCOS isolation. However, other similar isolation schemes such as poly-buffered LOCOS (PBL), framed LOCOS, framed poly-buffered LOCOS, and other similar techniques could also be employed effectively.

Although the present invention has been described in detail, it should be understood various changes and alterations described herein and a variety of other changes and alterations may be made to the teachings herein without departing from the spirit and scope of the present invention which is solely defined by the appended claims.

What is claimed is:

1. A method of forming an isolation structure in a semiconductor layer between first and second active regions in order to electrically isolate the first and second active regions one from the other, the semiconductor layer comprising an outer surface, the method comprising the steps of:

forming a LOCOS structure on the outer surface, the LOCOS structure formed to comprise a first bird's beak structure disposed adjacent the first active region and a second bird's beak structure disposed adjacent the second active region;

forming a first and second trench through the LOCOS structure between the first and second bird's beak structures and the semiconductor layer; and forming a first trench plug in the first trench and a second trench plug in the second trench, the first and second trenches each comprising sidewalls defining an interface between each of the first and second trench plugs and the semiconductor layer.

2. The method of claim 1 and further comprising the step of forming a channel stop region in the semiconductor layer adjacent the sidewalls of the first and second trenches.

3. The method of claim 2 wherein said step of forming a channel stop region comprises the step of diffusing impurities into the semiconductor layer using solid source materials.

4. The method of claim 1, wherein the semiconductor layer comprises a conductivity type and wherein said step of forming a channel stop region comprises the step of implanting impurities corresponding to the conductivity type.

5. The method of claim 1 wherein said step of forming a first and a second trench plug comprises the step of forming a region of polycrystalline semiconductor material and a region comprising an oxide of said semiconductor material in both said first and said second trenches.

6. The method of claim 1, wherein said step of forming a first and second trench plug comprises the step of forming a region comprising oxide and a region comprising phosphosilicon glass in both said first and said second trench.

7. The method of claim 1 wherein said step of forming a first and second trench plug comprises the step of forming a region comprising oxide and a region comprising borophosphosilicon glass in both said first and said second trench.

8. A method of forming an isolation structure in a semiconductor layer between first and second active regions in order to electrically isolate the first and second active regions one from the other, the semiconductor layer comprising an outer surface, the method comprising the steps of:

forming a pad oxide layer on the outer surface;

forming a nitride layer outwardly from the pad oxide layer;

forming a thick oxide layer outwardly from the nitride layer;

etching an opening through the thick oxide layer and the nitride layer to expose a portion of the pad oxide layer;

forming a LOCOS structure using the exposed portion of the pad oxide layer, the LOCOS structure formed to comprise a first bird's beak structure disposed adjacent the first active region and a second bird's beak structure disposed adjacent the second active region;

etching a trench through the LOCOS structure and into the semiconductor layer, the trench formed, in part, between the first and second bird's beak structures;

forming a channel stop region by introducing impurities into the semiconductor layer adjacent sidewalls of the trench;

forming a trench plug in the trench; and removing the remaining portions of the thick oxide and nitride layers.

9. The method of claim 8 wherein said step of forming a channel stop region comprises the step of implanting impurities into the semiconductor layer.

10. The method of claim 8 wherein said step of forming a channel stop region comprises the step-of diffusing impurities into the semiconductor layer using solid source materials.

11. The method of claim 8 and further comprising the step of forming, prior to said step of etching a trench, spacer structures outwardly from the LOCOS structure and adjacent the remaining portions of the nitride layer and the thick oxide layer.

12. The method of claim 8 wherein said step of forming a trench plug comprises the step of forming a region of polycrystalline semiconductor material and a region comprising an oxide of said semiconductor material.

13. The method of claim 8 wherein said step of forming a trench plug comprises the step of forming a region comprising oxide and a region comprising phosphosilicon glass.

14. The method of claim 8 wherein said step of forming a trench plug comprises the step of forming a region comprising oxide and a region comprising borophosphosilicon glass.

15. The method of claim 8 wherein said step of forming a trench plug comprises the step of foxing a first trench plug in a first trench and further comprising the steps of forming a second trench through said LOCOS structure proximate the first trench between the first and second bird's beak structures and in the semiconductor layer and foxing a second trench plug disposed in the second trench.

* * * * *